United States Patent
Diener

(10) Patent No.: US 10,041,730 B2
(45) Date of Patent: Aug. 7, 2018

(54) PLASMA VACUUM SYSTEM HAVING A COMPLETELY ENCLOSED CHAMBER EXTRUDED PROFILE

(71) Applicant: Christof-Herbert Diener, Nagold (DE)

(72) Inventor: Christof-Herbert Diener, Nagold (DE)

( * ) Notice: Subject to any disclaimer, the term of this patent is extended or adjusted under 35 U.S.C. 154(b) by 0 days.

(21) Appl. No.: 15/405,644

(22) Filed: Jan. 13, 2017

(65) Prior Publication Data
US 2017/0122663 A1     May 4, 2017

Related U.S. Application Data

(63) Continuation of application No. PCT/EP2015/065968, filed on Jul. 13, 2015.

(51) Int. Cl.
| | |
|---|---|
| *F26B 5/04* | (2006.01) |
| *H01J 37/32* | (2006.01) |
| *B01J 19/08* | (2006.01) |

(52) U.S. Cl.
CPC ............. *F26B 5/04* (2013.01); *B01J 19/088* (2013.01); *H01J 37/32458* (2013.01); *B01J 2219/0894* (2013.01)

(58) Field of Classification Search
CPC ... F26B 5/04; F26B 5/06; B01J 19/008; B01J 2219/0894; H01J 37/32458
(Continued)

(56) References Cited

U.S. PATENT DOCUMENTS

| | | | |
|---|---|---|---|
| 3,795,986 A * | 3/1974 | Sutherland ................ | F26B 5/06 34/284 |
| 4,526,670 A * | 7/1985 | Hajj .................. | H01L 21/67706 118/324 |

(Continued)

FOREIGN PATENT DOCUMENTS

| | | | |
|---|---|---|---|
| CA | 2905880 A1 * | 10/2014 | ............. A61L 2/208 |
| CN | 102712021 A | 10/2012 | |

(Continued)

OTHER PUBLICATIONS

C. Perkins, et al., "Vacuum System Design for the PEP-II B Factory High-Energy Ring," Presented at the Fourth European Particle Accelerater Conference (EPAC'94), London, England, Jun. 27-Jul. 21, 1994.
(Continued)

*Primary Examiner* — Stephen M Gravini
(74) *Attorney, Agent, or Firm* — Hackler Daghighian Martino & Novak

(57) ABSTRACT

A vacuum system, such as the form of a plasma system, includes a vacuum chamber. The side walls of the vacuum chamber are configured in the form of a completely closed chamber extruded profile. A first end face of the chamber extruded profile is closed off with a plate. A second end face of the chamber extruded profile, which lies opposite the first end face, has a reversibly openable and closable door. The door is fastened by at least one hinge pivotably to the chamber extruded profile. The side walls, which are fully closed transversely to the longitudinal axis of the chamber extruded profile, enable a simple and cost-effective production of the vacuum chamber. The vacuum chamber may be accommodated at least partially in a housing, which may likewise be configured at least partially in the form of an extruded profile.

9 Claims, 4 Drawing Sheets

(58) Field of Classification Search
USPC .................................................. 34/92; 29/428
See application file for complete search history.

(56) References Cited

U.S. PATENT DOCUMENTS

| | | | | |
|---|---|---|---|---|
| 5,288,218 | A * | 2/1994 | Melkonian | B29C 47/0028 264/177.17 |
| 5,746,434 | A * | 5/1998 | Boyd | H01J 37/18 277/312 |
| 5,822,882 | A * | 10/1998 | Anger | F26B 5/06 34/296 |
| 6,182,851 | B1 * | 2/2001 | Donde | B29C 47/0023 220/555 |
| 6,405,423 | B1 | 6/2002 | Donde | |
| 7,966,746 | B2 * | 6/2011 | Py | F26B 5/06 34/285 |
| 8,206,075 | B2 * | 6/2012 | White | H01L 21/67201 118/715 |
| 8,648,977 | B2 * | 2/2014 | Leung | H01L 21/67772 220/378 |
| 9,850,036 | B2 * | 12/2017 | Sanfilippo | B65D 33/16 |
| 2008/0286697 | A1 | 11/2008 | Verhaverbeke et al. | |
| 2013/0047692 | A1 | 2/2013 | Pasqualon et al. | |
| 2014/0061202 | A1 | 3/2014 | Mathieu et al. | |
| 2015/0001234 | A1 * | 1/2015 | Sanfilippo | B65D 75/5838 220/834 |
| 2015/0374868 | A1 * | 12/2015 | Bruce | A61L 2/208 422/3 |
| 2017/0122663 | A1 * | 5/2017 | Diener | F26B 5/04 |

FOREIGN PATENT DOCUMENTS

| | | | | |
|---|---|---|---|---|
| CN | 202673051 U | | 1/2013 | |
| DE | 102007021386 A1 * | 11/2008 | | H01J 37/32009 |
| DE | 102007060515 A1 * | 6/2009 | | B05D 3/144 |
| DE | 102009002337 A1 * | 10/2010 | | G01N 31/22 |
| EP | 1 221 492 A2 | | 7/2002 | |
| EP | 2 116 113 A1 | | 11/2009 | |
| WO | 84 02287 A1 | | 6/1984 | |
| WO | 2008 100056 A1 | | 8/2008 | |
| WO | WO 2014159696 A1 * | 10/2014 | | A61L 2/208 |

OTHER PUBLICATIONS

Emil Trakhtenberg, et al., "Extruded Aluminum Vacuum Chambers for Insertion Devices," ASD Seminar, May 23, 2011.

* cited by examiner

PLASMA VACUUM SYSTEM HAVING A COMPLETELY ENCLOSED CHAMBER EXTRUDED PROFILE

CROSS-REFERENCE TO RELATED APPLICATIONS

This continuation application claims priority to PCT/EP2015/065968 filed on Jul. 13, 2015 which has published as WO 2016/008844 A1 and also the German application number 10 2014 213 942.2 filed on Jul. 17, 2014, the entire contents of which are fully incorporated herein with these references.

FIELD OF THE INVENTION

The invention relates to a vacuum system having a vacuum chamber, in which that outer side of the vacuum chamber which runs parallel to the vacuum chamber central longitudinal axis is formed in one piece from a chamber extruded profile.

BACKGROUND OF THE INVENTION

Such a vacuum system of the generic type has been disclosed in U.S. Pat. No. 6,405,423 B1. The known vacuum system has a vacuum chamber. The side walls of the vacuum chamber consist of a chamber extruded profile. The end faces of the chamber extruded profile are closed off by plates screwed onto the chamber extruded profile. The chamber extruded profile has on at least one outer side configured perpendicular to the end face of the chamber extruded profile, i.e. on a side wall, an opening for loading and unloading of the vacuum chamber. The opening must be laboriously milled into the chamber extruded profile.

In contrast, the object of the present invention is to provide a vacuum system whose vacuum chamber has a high leak-tightness and yet can be produced in a simple and cost-effective manner.

This object is achieved by a vacuum system according to the independent claim. The dependent claims define other preferred refinements.

SUMMARY OF THE INVENTION

The object according to the invention is thus achieved by a vacuum system having a vacuum chamber, in which that outer side of the vacuum chamber which runs parallel to the vacuum chamber central longitudinal axis is formed in one piece from a chamber extruded profile, wherein the chamber extruded profile is configured such that it is fully closed transversely to the vacuum chamber central longitudinal axis and has an end-face door which can be reversibly opened and closed.

According to the invention, the laborious milling of an opening into the chamber extruded profile is thus dispensed with. Rather, the chamber extruded profile is configured such that it is closed transversely to the vacuum chamber central longitudinal axis. The loading and unloading of the vacuum chamber is realized via its end face, which is configured in the form of a door which can be reversibly opened and closed. In contrast to U.S. Pat. No. 6,405,423 B1, the chamber extruded profile, in the vacuum system according to the invention, is thus not employed in vertically upright, but in horizontally lying position. During operation of the vacuum system, the vacuum chamber central longitudinal axis therefore runs horizontally. All in all, the vacuum system according to the invention can hereby be designed significantly more simply and can thus be produced more cost-effectively.

The vacuum chamber can have on a first end face a hatch door. A hatch door of this kind can be sucked in by means of a pump in order to close off the vacuum chamber. Alternatively thereto, the vacuum chamber can have on a first end face a sliding door. Both in the case of a hatch door and in the case of a slidable door, the vacuum chamber can be configured without any hinges. Preferably, however, the vacuum chamber has on a first end face a pivotably openable and closable door. The pivot axis of the door here preferably runs transversely to the vacuum chamber central longitudinal axis, in particular perpendicular to an axis parallel to the vacuum chamber central longitudinal axis. The vacuum system can thereby be designed particularly simply, and more cost-effectively.

For the configuration of a door, which is pivotable on the end face, on the chamber extruded profile, the chamber extruded profile can have on its outer side a first hinge projection, which runs parallel to the vacuum chamber central longitudinal axis and on which is disposed a first hinge for the pivotable connection between door and chamber extruded profile. As a result of the first hinge projection, the fitting of a first hinge is made significantly easier.

The chamber extruded profile can have on its outer side a second hinge projection, which runs parallel to the vacuum chamber central longitudinal axis and on which is disposed a second hinge for the pivotable connection between door and chamber extruded profile. The second hinge consolidates the pivotable connection between door and chamber extruded profile, so that the leak-tightness between door and chamber extruded profile is significantly increased.

For the closing of the door on the chamber extruded profile, the vacuum system can have a first latch, which is disposed on a first latch holder projection, wherein the latch holder projection is configured parallel to the vacuum chamber central longitudinal axis on the outer side of the chamber extruded profile.

In a preferred embodiment of the invention, the chamber extruded profile has on its outer side a second latch holder projection, which runs parallel to the vacuum chamber central longitudinal axis and on which is disposed a second latch for the closing of the door on the chamber extruded profile. As a result of the second latch, the leak-tightness between door and chamber extruded profile is further increased.

The chamber extruded profile can further have on its outer side a cooling rib running parallel to the vacuum chamber central longitudinal axis. Preferably, the chamber extruded profile has on its outer side a multiplicity of cooling ribs running parallel to the vacuum chamber central longitudinal axis. As a result of the cooling rib(s), a water cooling system can in many applications be dispensed with.

The vacuum system preferably has a housing. For fastening of the vacuum chamber to this housing, the chamber extruded profile can have on its outer side a first fastening projection running parallel to the vacuum chamber central longitudinal axis. The first fastening projection facilitates the fitting of the vacuum chamber to the housing, so that assembly costs are lowered.

Preferably, the chamber extruded profile has on its outer side a second fastening projection, running parallel to the vacuum chamber central longitudinal axis, for fastening the vacuum chamber to the housing of the vacuum system. As a result of the second fastening projection, the vacuum chamber is fastened particularly simply from a design aspect, and at the same time securely, to the housing of the vacuum system.

In another preferred embodiment of the invention, the chamber extruded profile has on its inner side two mutually opposing insertion recesses, running parallel to the vacuum chamber central longitudinal axis, for the insertion of a plate. The creation of a specimen mounting inside a vacuum chamber is thereby made significantly easier.

Preferably, the chamber extruded profile has on its inner side two mutually opposing insertion recesses, running parallel to the vacuum chamber central longitudinal axis, for the insertion of plates. Already in the manufacture of the chamber extruded profile, a plurality of plate mountings are hereby produced, so that the creation of the vacuum system is made significantly easier.

A second end face of the extruded profile, which lies opposite the first end face, can have a flange for the introduction and/or evacuation of a medium into or out of the chamber.

A particularly simple and cost-effective creation of the vacuum chamber is realized if the chamber extruded profile is formed of aluminum or an aluminum alloy.

The creation of the vacuum system is additionally made significantly easier if the vacuum system has a housing in which the vacuum chamber is accommodated, wherein a part of the housing which runs parallel to the vacuum chamber central longitudinal axis is configured in the form of a housing extruded profile. In other words, the creation of the vacuum system is made easier by virtue of the fact that not only a crucial part of the vacuum chamber, namely the chamber extruded profile, but also a part of the housing, namely the housing extruded profile, can be produced by an extrusion process.

In another preferred embodiment of the invention, the chamber extruded profile is configured in one piece with the housing of the extruded profile.

The vacuum system can be configured in the form of a vacuum dryer.

To this end, the vacuum system can have a pump for the at least partial evacuation of the vacuum chamber. In addition, the vacuum system can have a heating system.

The extruded profile, at least on its inner side, can be nickel-plated in order to avoid corrosion. Preferably, the whole of the vacuum chamber is nickel-plated on its inner side.

In another preferred embodiment of the invention, the vacuum system is configured in the form of a plasma system. In this case, at least one plasma electrode can be arranged inside the vacuum chamber. The vacuum system in the form of a plasma system can further have a pump, a vent valve, a gas flow meter, a pressure indicator and/or a high-voltage supply.

In summary, the following variants for the use of an extruded profile within the vacuum system according to the invention are conceivable:
a) the vacuum chamber has a chamber extruded profile;
b) the vacuum system has a housing extruded profile.

The chamber extruded profile can be connected to the housing extruded profile. For instance, the chamber extruded profile can be welded and/or bolted to the housing extruded profile. Alternatively thereto, the chamber extruded profile and the housing extruded profile can be configured in one piece, i.e. integrally.

Further features and advantages of the invention emerge from the following detailed description of a plurality of illustrative embodiments of the invention on the basis of the figures of the drawing, which shows details fundamental to the invention, and also from the claims.

BRIEF DESCRIPTION OF THE DRAWINGS

The features shown in the drawing are represented in such a way that the particularities according to the invention can be made clearly visible. The various features can each be realized in isolation or in plurality in any chosen combinations in variants of the invention, wherein.

DETAILED DESCRIPTION OF THE PREFERRED EMBODIMENTS

Figure 1:
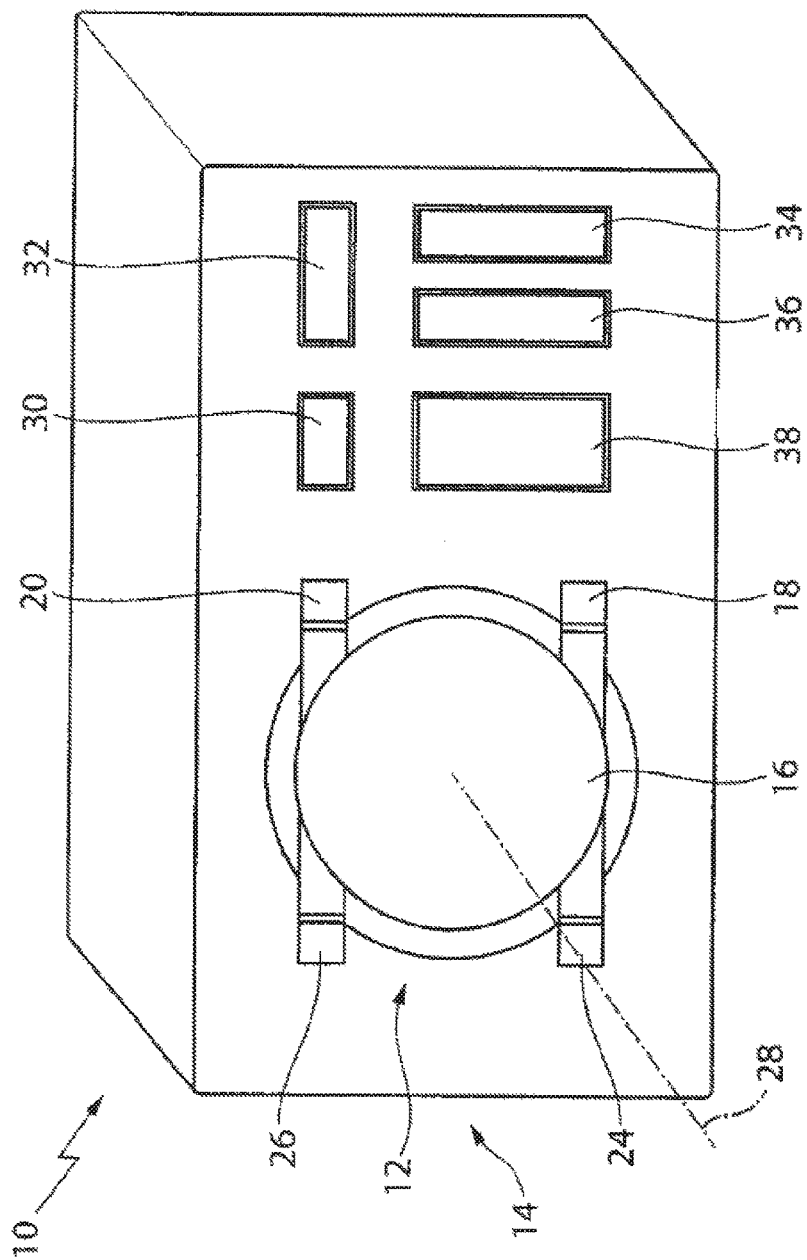
FIG. 1 shows a perspective view of a vacuum system in the form of a plasma system.

FIG. 1 shows a vacuum system 10 having a vacuum chamber 12. The vacuum chamber 12 is very largely surrounded by a housing 14. The vacuum chamber 12 has a door 16, which is pivotably openable and closable by hinges 18, 20. The hinges 18, 20 are fastened at one end to the door 16 and at the other end to a chamber extrusion profile 22 (see FIG. 2). For the closing of the door 16 on the chamber extruded profile 22, latches 24, 26 are provided. The latches 24, 26 are fastened at one end to the chamber extruded profile 22 (see FIG. 2) and engage at the other end, when the door 16 is closed, in corresponding mountings of the door 16.

The vacuum chamber 12 is arranged horizontally, i.e., in the operating state of the vacuum system 10, a vacuum chamber central longitudinal axis 28 runs in the horizontal direction.

The vacuum system 10 has a pressure indicator 30, a timer 32, gas flow control devices 34, 36, and a high-voltage control system 38. The pressure indicator 30 serves to indicate the internal pressure of the vacuum chamber 12. The timer 32 serves to set a process time. As a result of the gas flow measuring devices 34, 36, the gas flow into the vacuum chamber 12 can be set and monitored. The high-voltage control system 38 serves to supply voltage to a plasma electrode (not shown) in the vacuum chamber 12.

Figure 2:
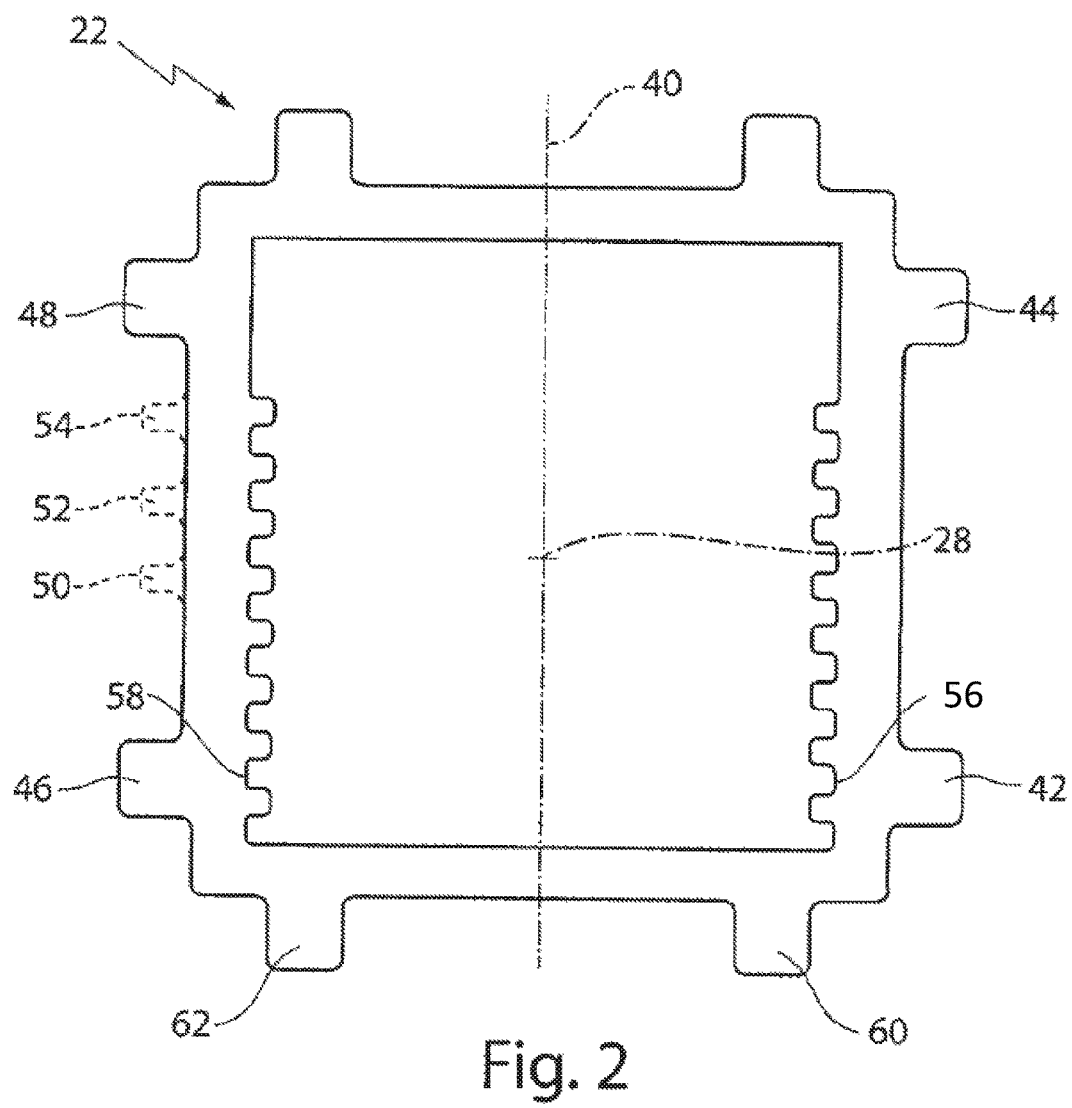
FIG. 2 shows a top view of a first chamber extruded profile.

FIG. 2 shows the chamber extruded profile 22. The chamber extruded profile 22 is configured uniformly in the direction of the vacuum chamber central longitudinal axis 28, which in FIG. 2 is shown merely in punctiform representation. In addition, the chamber extruded profile 22 is configured symmetrically to a vacuum chamber central longitudinal plane 40. The chamber extruded profile 22 is formed of aluminum.

The chamber extruded profile 22 has on its outer side a first hinge projection 42 and a second hinge projection 44. The hinges 18, 20 (see FIG. 1) are fitted on the hinge projections 42, 44. The chamber extruded profile 22 further has a first latch holder projection 46, on which the first latch 24 (see FIG. 1) is fitted. The second latch 26 (see FIG. 1) is fastened to a second latch holder projection 48. The projections 42, 44, 46, 48 enable a structurally simple and, at the same time, very leak-tight arrangement of the door 16 (see FIG. 1) on the chamber extruded profile 22 in pivotable arrangement.

For the cooling of the chamber extruded profile 22, this can have on its outer side one or more cooling ribs 50, 52, 54 (shown in dashed representation in FIG. 2).

The chamber extruded profile 22 has on its inner side a plurality of insertion recesses, into which a plate (not shown) can respectively be introduced. For reasons of clarity, only a first insertion recess 56 and a second insertion recess 58 are in FIG. 2 provided with a reference symbol. The insertion recesses 56, 58 are configured lying opposite each other, symmetrically to the vacuum chamber longitudinal plane 40.

For fastening of the chamber extruded profile 22 to the housing 14 (see FIG. 1), the chamber extruded profile 22 has fastening projections 60, 62.

Figure 3:
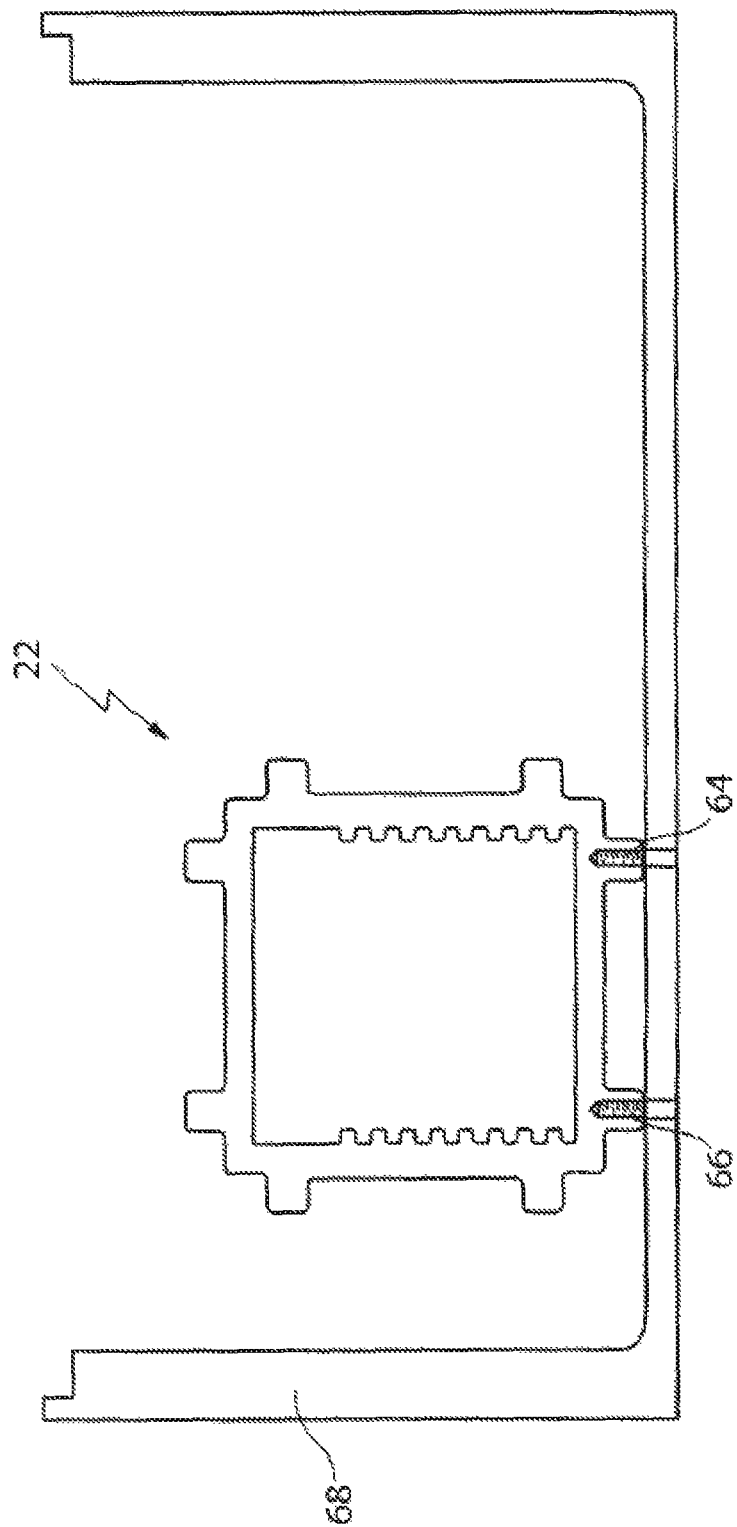
FIG. 3 shows a top view of the first chamber extruded profile according to FIG. 2, wherein the first chamber extruded profile is fastened to a first housing extruded profile.

FIG. 3 shows the chamber extruded profile 22, which is fitted via fastening means 64, 66 on a housing extruded profile 68. The housing extruded profile 68 constitutes a part of the housing 14 (see FIG. 1). In the present case, the fastening means 64, 66 are configured in the form of screws.

Figure 4:
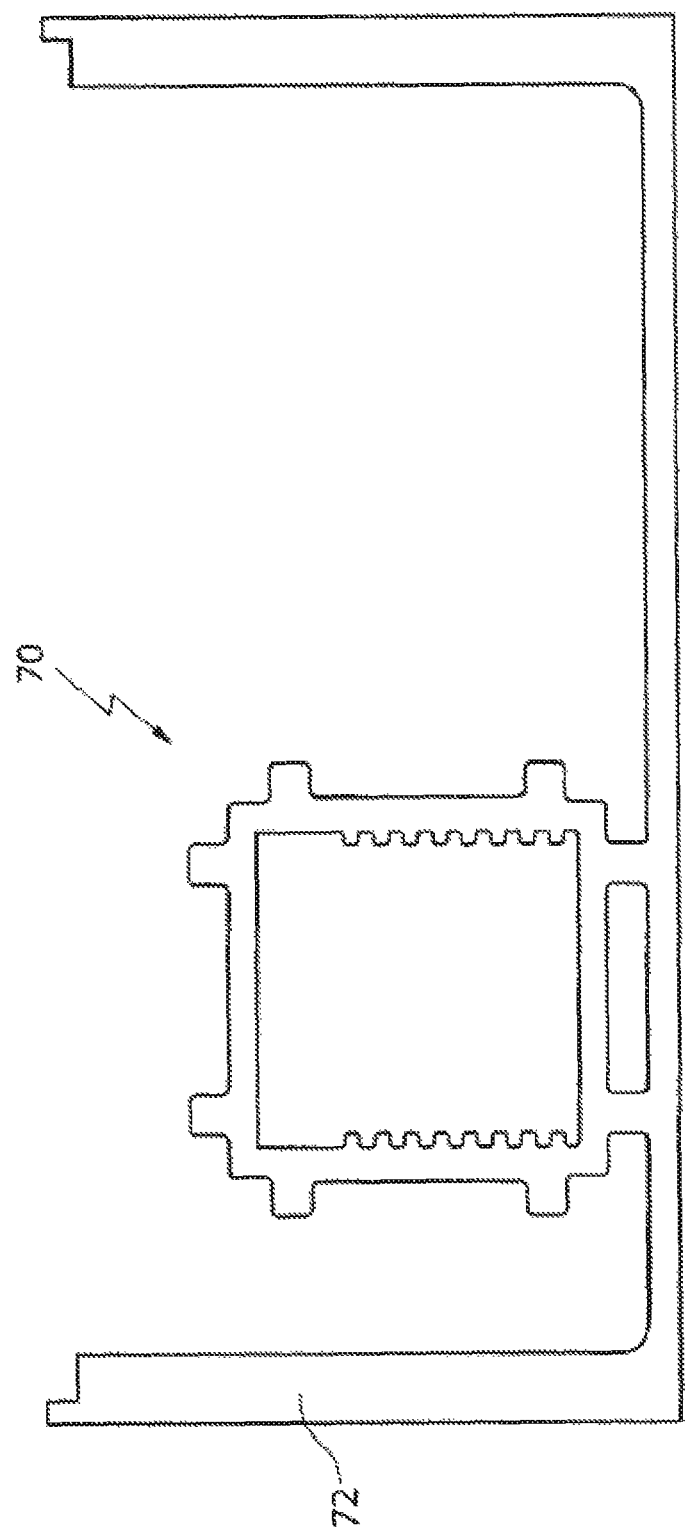
FIG. 4 shows a top view of a second chamber extruded profile, which is configured in one piece with a second housing extruded profile.

FIG. 4 shows a second chamber extruded profile 70 and a second housing extruded profile 72, wherein the extruded profiles 70, 72, in contrast to the extruded profiles 22, 68 (see FIG. 3), are configured in one piece with each other. A particularly efficient production of a vacuum system can hereby be achieved.

In summary, the invention relates to a vacuum system, in particular in the form of a plasma system. The vacuum system has a vacuum chamber. The side walls of the vacuum chamber are configured in the form of a completely closed chamber extruded profile. A first end face of the chamber extruded profile is preferably closed off with a plate. A second end face of the chamber extruded profile, which lies opposite the first end face, has a reversibly openable and closable door. The door is preferably fastened by at least one hinge pivotably to the chamber extruded profile. The side walls, which are fully closed transversely to the longitudinal axis of the chamber extruded profile, enable a simple and cost-effective production of the vacuum chamber. Preferably, the vacuum chamber is accommodated at least partially in a housing, which is likewise configured at least partially in the form of an extruded profile.

What is claimed is:

1. A vacuum system having a vacuum chamber, wherein an outer side of the vacuum chamber which runs parallel to a vacuum chamber central longitudinal axis is formed in one piece from a chamber extruded profile, wherein the chamber extruded profile is configured such that the chamber extruded profile is fully closed transversely to the vacuum chamber central longitudinal axis and has an end-face opening which can be opened and closed by a pivotably openable and closable door, wherein the chamber extruded profile has on the outer side a hinge projection which runs parallel to the vacuum chamber central longitudinal axis and extends outwardly from the outer side and on which is disposed a hinge for the pivotable connection between the pivotably openable and closable door door and the chamber extruded profile.

2. The vacuum system as claimed in claim 1, wherein the chamber extruded profile has on the outer side a latch holder projection which runs parallel to the vacuum chamber central longitudinal axis and on which is disposed a latch for the closing of the pivotably openable and closable door on the chamber extruded profile.

3. The vacuum system as claimed in claim 1, wherein the chamber extruded profile has on the outer side a cooling rib running parallel to the vacuum chamber central longitudinal axis.

4. The vacuum system as claimed in claim 1, wherein the chamber extruded profile has on the outer side a fastening projection running parallel to the vacuum chamber central longitudinal axis for fastening the vacuum chamber to a housing of the vacuum system.

5. The vacuum system as claimed in claim 1, wherein the chamber extruded profile has on a chamber extruded profile inner side two mutually opposing insertion recesses running parallel to the vacuum chamber central longitudinal axis for the insertion of a plate.

6. The vacuum system as claimed in claim 1, wherein the vacuum system has a housing in which the vacuum chamber is accommodated, wherein a part of the housing which runs parallel to the vacuum chamber central longitudinal axis is configured in a form of a housing extruded profile.

7. The vacuum system as claimed in claim 1, wherein the vacuum system is configured in a form of a vacuum dryer.

8. The vacuum system as claimed in claim 1, wherein the vacuum system is configured in a form of a plasma system.

9. A vacuum system, comprising:
   a vacuum chamber, wherein an outer side of the vacuum chamber which runs parallel to a vacuum chamber central longitudinal axis is formed in one piece from a chamber extruded profile, wherein the chamber extruded profile is configured such that the chamber extruded profile is fully closed transversely to the vacuum chamber central longitudinal axis and has at least one end-face opening;
   a pivotably openable and closable door configured to open and close the at least one end-face opening of the chamber extruded profile;
   a hinge projection formed as part of the chamber extruded profile which runs parallel to the vacuum chamber central longitudinal axis and extends outwardly from the outer side; and
   a hinge disposed on the hinge projection, wherein the hinge is a pivotable connection between the pivotably openable and closable door and the chamber extruded profile.

* * * * *

UNITED STATES PATENT AND TRADEMARK OFFICE
CERTIFICATE OF CORRECTION

PATENT NO. : 10,041,730 B2
APPLICATION NO. : 15/405644
DATED : August 7, 2018
INVENTOR(S) : Christof-Herbert Diener Page 1 of 1

It is certified that error appears in the above-identified patent and that said Letters Patent is hereby corrected as shown below:

In the Claims

Column 6, Line 4, Claim 1 the second occurrence of the word "door" should be deleted.

Signed and Sealed this
Eighteenth Day of September, 2018

Andrei Iancu
*Director of the United States Patent and Trademark Office*